United States Patent
Chang et al.

(10) Patent No.: US 12,181,224 B2
(45) Date of Patent: Dec. 31, 2024

(54) HEAT DISSIPATION DEVICE

(71) Applicant: ASUSTeK COMPUTER INC., Taipei (TW)

(72) Inventors: Jung-Kai Chang, Taipei (TW); Chi-Yeh Chen, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 17/958,429

(22) Filed: Oct. 2, 2022

(65) Prior Publication Data
US 2023/0221078 A1    Jul. 13, 2023

(30) Foreign Application Priority Data

Jan. 13, 2022    (TW) ................................. 111200468

(51) Int. Cl.
*F28D 15/02*    (2006.01)
*F28D 21/00*    (2006.01)

(52) U.S. Cl.
CPC .. *F28D 15/0275* (2013.01); *F28D 2021/0029* (2013.01)

(58) Field of Classification Search
CPC ............ F28D 15/0233; F28D 15/0266; F28D 15/0275; F28D 15/046; F28D 2021/0029; H01L 23/427; H05K 7/20336; H05K 7/20663; F28F 1/32; G06F 1/20; G06F 2200/201
USPC .................................................. 165/104.21
See application file for complete search history.

(56) References Cited

U.S. PATENT DOCUMENTS

| | | | |
|---|---|---|---|
| 8,496,047 B2 * | 7/2013 | Chang ................. | F28D 15/0266 165/104.21 |
| 10,048,017 B2 * | 8/2018 | Lan ....................... | H01L 23/427 |
| 2002/0144804 A1 * | 10/2002 | Liang .................. | F28D 15/0233 165/185 |

(Continued)

FOREIGN PATENT DOCUMENTS

| CN | 106802100 A | * 6/2017 | ......... F28D 15/0283 |
|---|---|---|---|
| CN | 210491493 | 5/2020 | |

(Continued)

OTHER PUBLICATIONS

Machine Translation TW 624377U (Year: 2021).*

*Primary Examiner* — Len Tran
*Assistant Examiner* — Gustavo A Hincapie Serna
(74) *Attorney, Agent, or Firm* — JCIPRNET

(57) ABSTRACT

A heat dissipation device including a heat dissipation fin group, a plurality of heat pipes, and a vapor chamber is provided. The heat dissipation fin group includes a plurality of fins arranged along an extension direction and is divided into a first fin group, a second fin group, and a third fin group. The third fin group is disposed between the first fin group and the second fin group. Each fin of the first fin group and the second group includes a plurality of through holes. Each fin of the third fin group includes a plurality of notches. The heat pipes are disposed through the first fin group and the second fin group by the through holes. The vapor chamber is correspondingly disposed on the third fin group and includes a plurality of grooves. The vapor chamber is in contact with the heat pipes exposed from the notches.

5 Claims, 8 Drawing Sheets

(56) References Cited

U.S. PATENT DOCUMENTS

| | | | | |
|---|---|---|---|---|
| 2005/0263265 | A1* | 12/2005 | Sheng | F28D 15/0275 165/104.21 |
| 2009/0059524 | A1* | 3/2009 | Peng | H01L 23/427 361/709 |
| 2011/0000649 | A1* | 1/2011 | Joshi | H01L 23/467 165/185 |
| 2011/0197596 | A1* | 8/2011 | Cheng | F28D 15/00 165/104.34 |
| 2011/0305020 | A1* | 12/2011 | Wang | F21V 5/04 362/249.02 |
| 2011/0308776 | A1* | 12/2011 | Huang | H01L 23/3672 165/185 |
| 2013/0206369 | A1* | 8/2013 | Lin | F28D 15/043 165/104.26 |
| 2014/0116659 | A1* | 5/2014 | Lin | F28F 1/32 165/121 |
| 2017/0156240 | A1* | 6/2017 | Silvennoinen | H05K 7/20936 |
| 2018/0080717 | A1* | 3/2018 | Kawabata | F28D 15/0275 |
| 2018/0106552 | A1* | 4/2018 | Lin | F28D 15/0266 |
| 2018/0196483 | A1* | 7/2018 | Han | H01L 23/3672 |
| 2020/0068745 | A1* | 2/2020 | Lin | H05K 7/20336 |
| 2020/0355443 | A1* | 11/2020 | Tochigi | F28D 15/0275 |
| 2021/0318072 | A1* | 10/2021 | Ito | H05K 7/20409 |
| 2022/0022339 | A1* | 1/2022 | Chen | F28D 15/046 |
| 2022/0107139 | A1* | 4/2022 | Takao | F28D 15/04 |
| 2022/0322564 | A1* | 10/2022 | Kubo | H05K 7/20809 |
| 2022/0346276 | A1* | 10/2022 | Lin | H05K 7/20327 |
| 2022/0354019 | A1* | 11/2022 | Tsai | F28F 3/12 |
| 2022/0373274 | A1* | 11/2022 | Nishikawa | F28F 3/06 |
| 2023/0152044 | A1* | 5/2023 | Xiong | F28D 15/046 165/104.26 |

FOREIGN PATENT DOCUMENTS

| | | | | |
|---|---|---|---|---|
| DE | 102021126988 | A1 * | 10/2022 | G06F 1/206 |
| TW | M302251 | | 12/2006 | |
| TW | 624377 | U * | 3/2022 | |

* cited by examiner

HEAT DISSIPATION DEVICE

CROSS-REFERENCE TO RELATED APPLICATION

This application claims the priority benefit of Taiwan application serial no. 111200468, filed on Jan. 13, 2022. The entirety of the above-mentioned patent application is hereby incorporated by reference herein and made a part of this specification.

BACKGROUND

Technical Field

The disclosure relates to a heat dissipation device.

Description of Related Art

The heat pipe is usually installed in the heat dissipation module through processes such as flattening, bending and shaping. However, irregularly shaped heat pipes will increase the path length for heat transfer, resulting in loss of heat transfer efficiency. In addition, in order to match the irregular-shaped heat pipes, the position of the heat-radiating fins should avoid the bending part of the heat pipes. Therefore, the effective heat dissipation area is reduced and the heat dissipation performance is affected.

SUMMARY

A heat dissipation device including a heat dissipation fin group, a plurality of heat pipes, and a vapor chamber is provided. The heat dissipation fin group includes a plurality of fins arranged along an extension direction and is divided into a first fin group, a second fin group, and a third fin group. The third fin group is disposed between the first fin group and the second fin group.

Each fin of the first fin group and the second group includes a plurality of through holes. Each fin of the third fin group includes a plurality of notches. The heat pipes are cylindrical structure. The heat pipes are disposed through the first fin group and the second fin group by the through holes. A part of the heat pipes corresponding to the third fin group is in contact with the notches, and the other part is exposed to the outside.

The vapor chamber is correspondingly disposed on the third fin group and includes a plurality of grooves. The vapor chamber is in contact with the heat pipes exposed from the grooves. Wherein the grooves extend along the extension direction and have a shape associated with the cylindrical structure.

A groove is formed on the vapor chamber in the application. And the groove corresponds to the shape of the heat pipes, thereby increasing the effective heat dissipation area between the heat pipe and the heat pipe. And the heat pipes adopt a straight pipe structure, and no additional shaping is required. Therefore, the loss of heat transfer efficiency can be reduced, thereby improving the heat transfer efficiency of the heat pipes.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
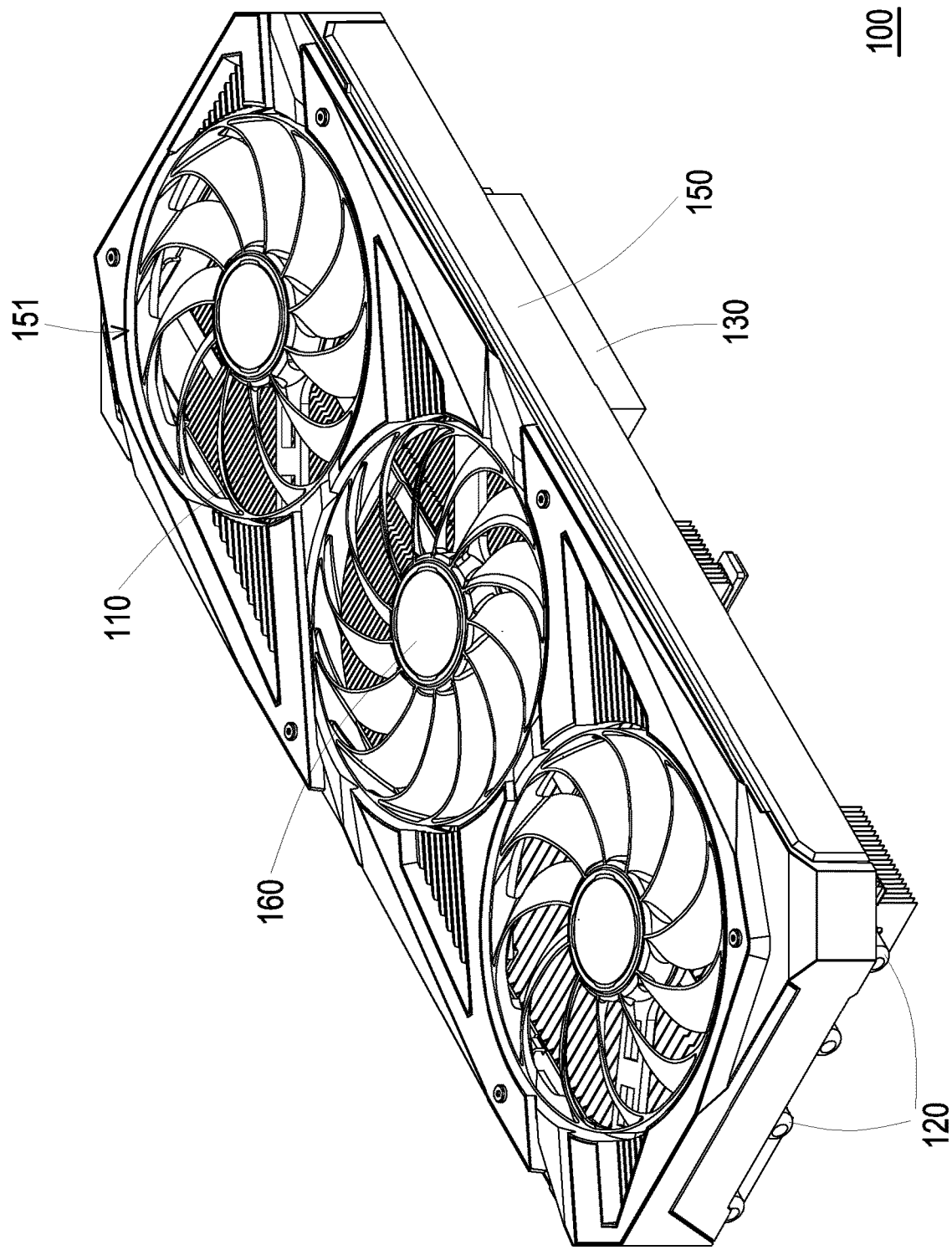
FIG. 1A is a stereoscopic schematic diagram of the heat dissipation device according to the application.

Referring to FIG. 1A to FIG. 1D, the heat dissipation device 100 provided in the application includes a heat dissipation fin group 110, a plurality of heat pipes 120, and a vapor chamber 130. The heat dissipation fin group 110 includes a plurality of fins. These fins are arranged along an extension direction D and are divided into a first fin group 111, a second fin group 112, and a third fin group 113.

The third fin group 113 is disposed between the first fin group 111 and the second fin group 112, wherein each fin of the first fin group 111 and the second group 112 includes a plurality of through holes 114, and each fin of the third fin group 113 includes a plurality of notches 115. In an embodiment, the fins are arranged in parallel with each other.

Figure 1B:
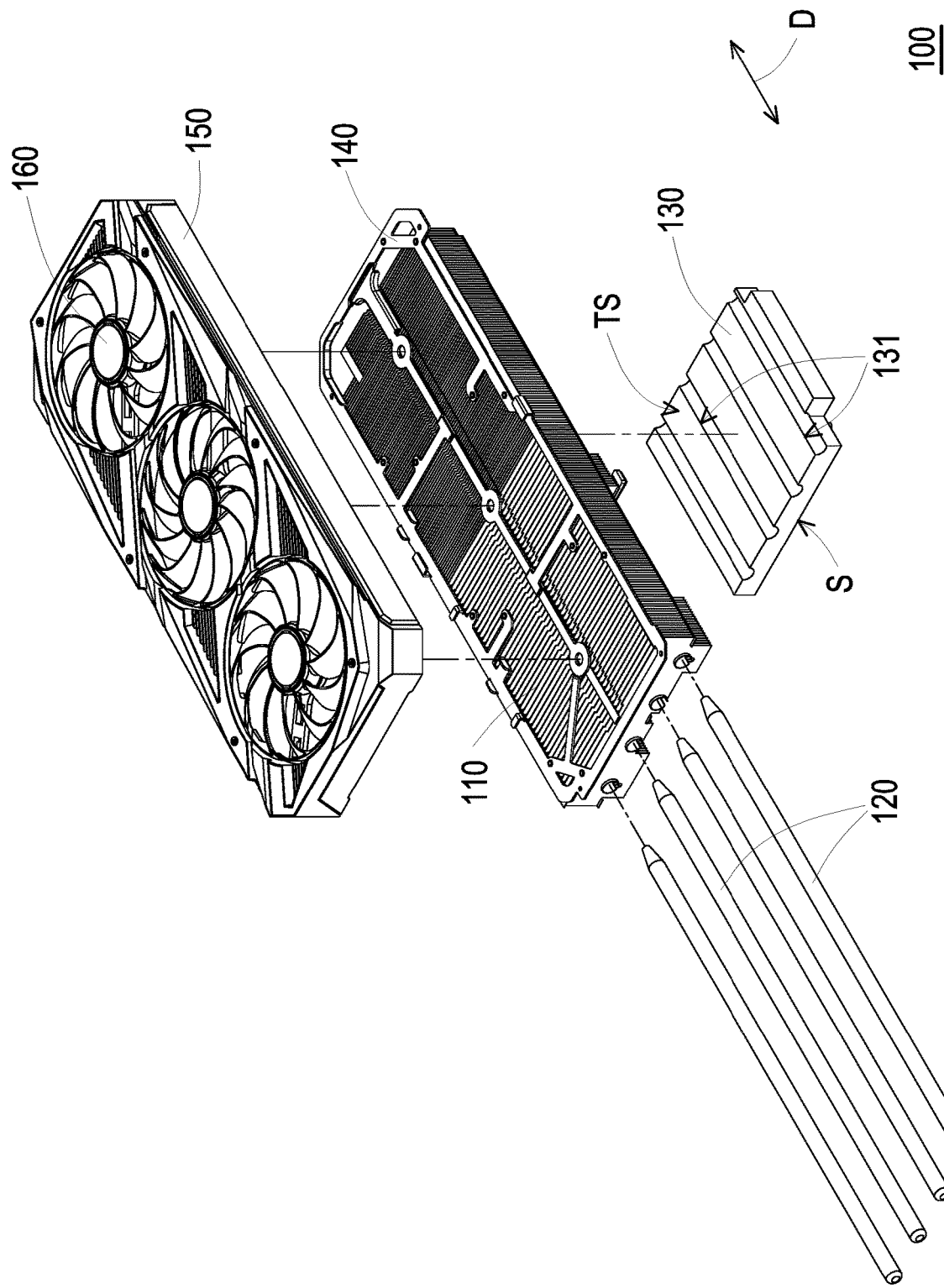
FIG. 1B is an exploded schematic diagram of the components of the heat dissipation device of FIG. 1A.

Referring to FIG. 1A and FIG. 1B, in an embodiment, the number of the heat pipes 120 is four, and they are all cylindrical structures. The heat pipes 120 are disposed through the first fin group 111 and the second fin group 112 by the through holes 114.

A part of the heat pipes 120 corresponding to the third fin group 113 is in contact with the notches 115, and the other part is exposed to the outside. In short, the heat pipes 120 pass through the heat dissipation fin group 110 and contact the first fin group 111, the second fin group 112 and the third fin group 113 respectively. Meanwhile, both ends of each heat pipe 120 protrude from two sides of the heat dissipation fin group 110 respectively.

Figure 2A:
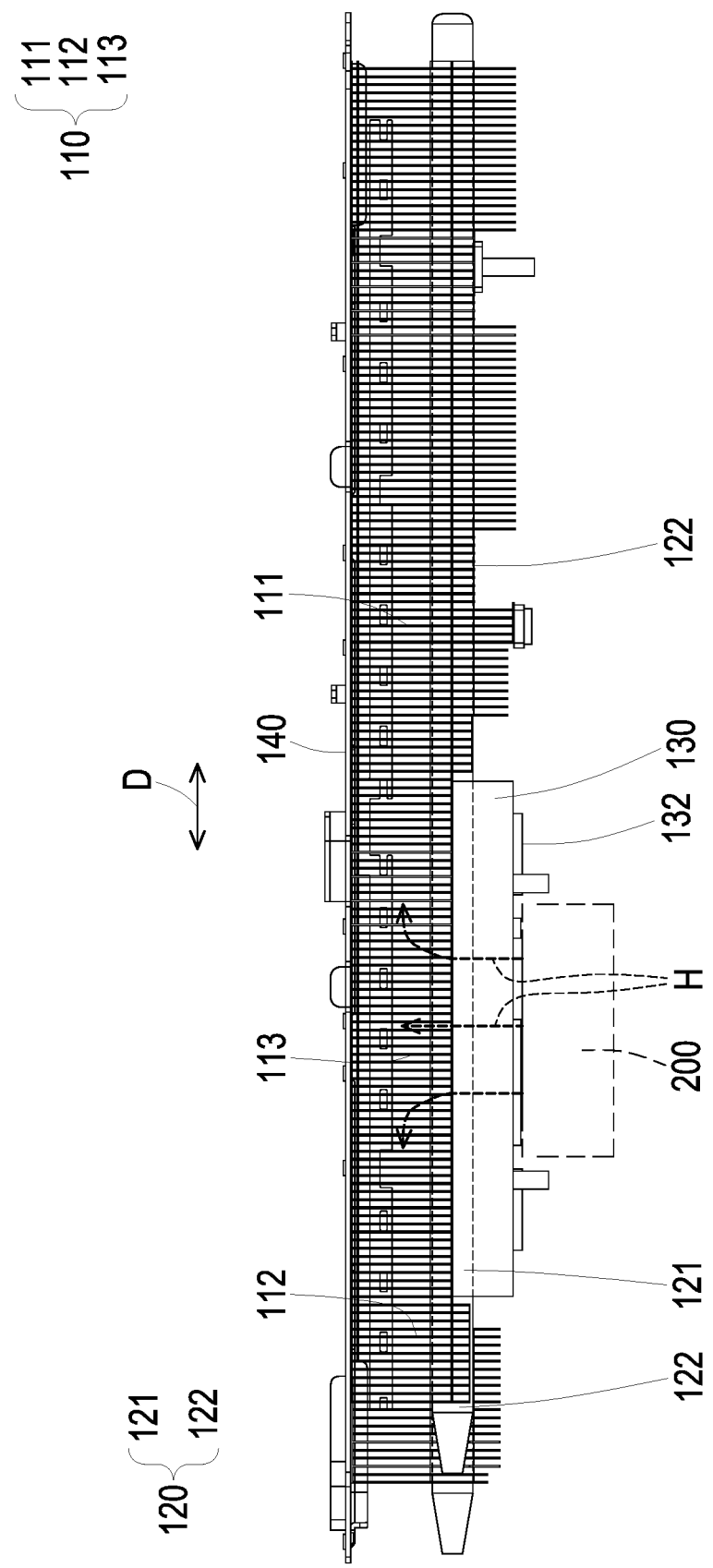
FIG. 2A is a schematic side view of the heat dissipation fin group, the vapor chamber and the heat pipes of the heat dissipation device of FIG. 1A.
Figure 2B:
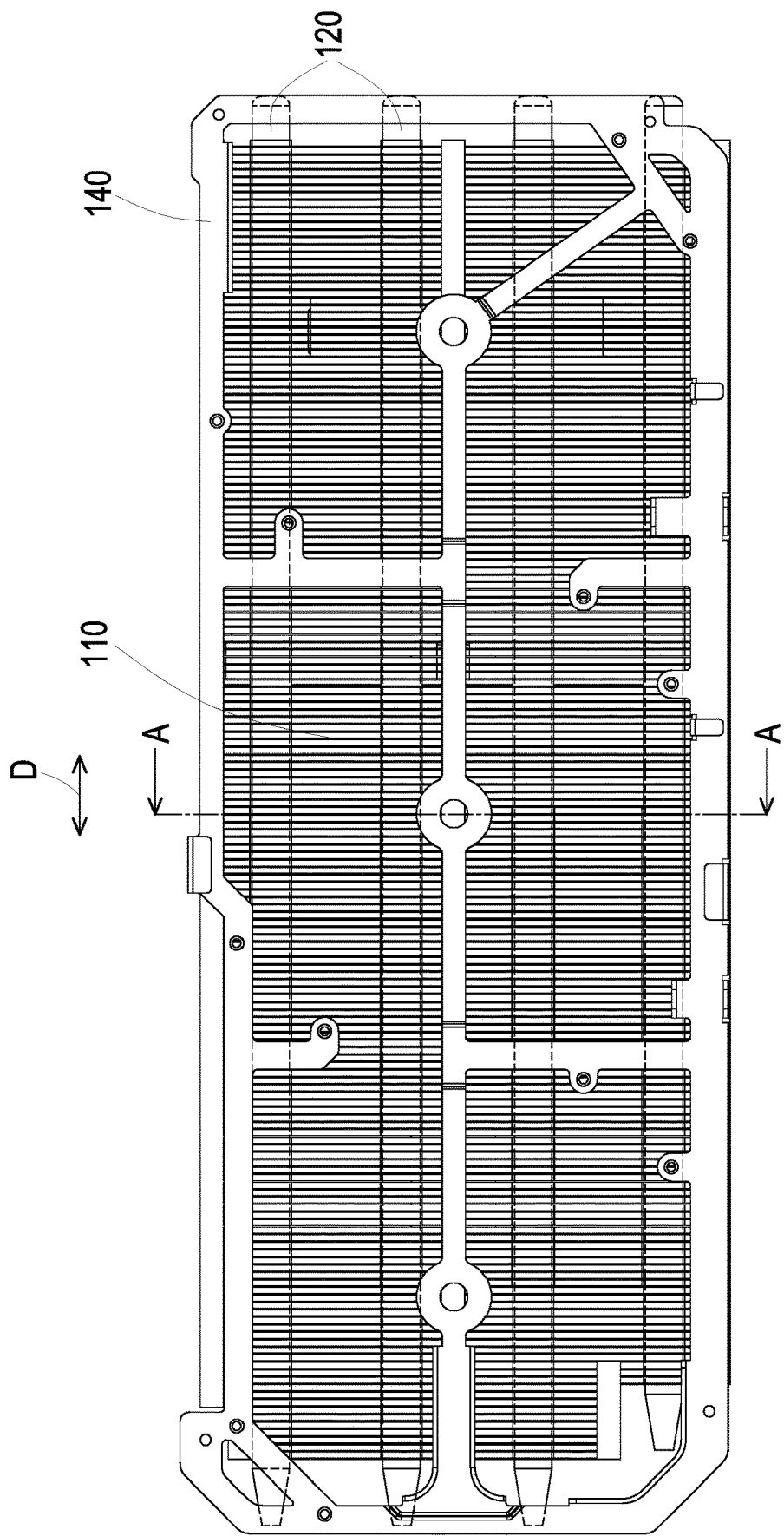
FIG. 2B is a schematic top view of the heat dissipation fin group, the vapor chamber and the heat pipes of FIG. 2A.
Figure 2C:
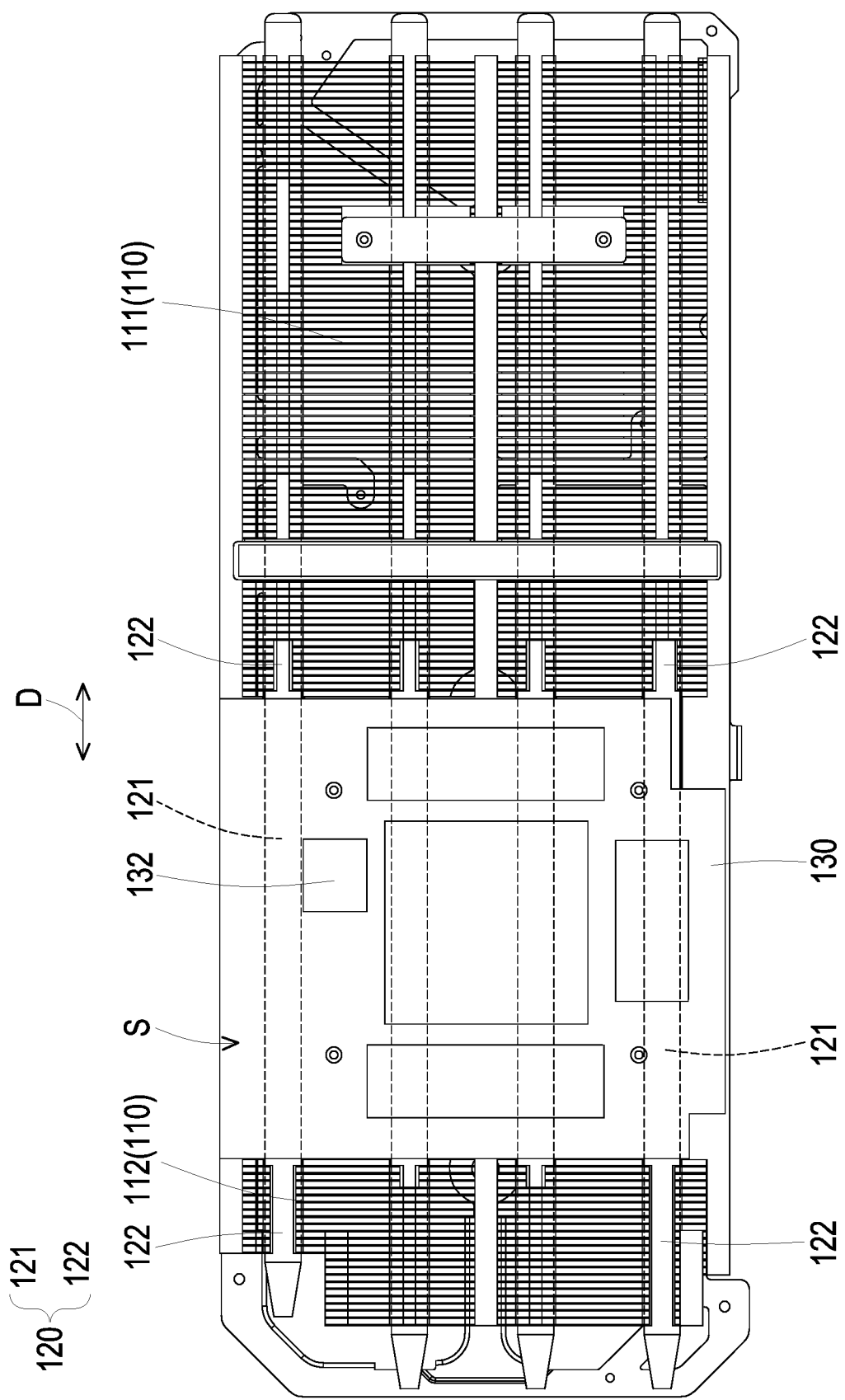
FIG. 2C is a schematic bottom view of the heat dissipation fin group, the vapor chamber and the heat pipes of FIG. 2A.
Figure 2D:
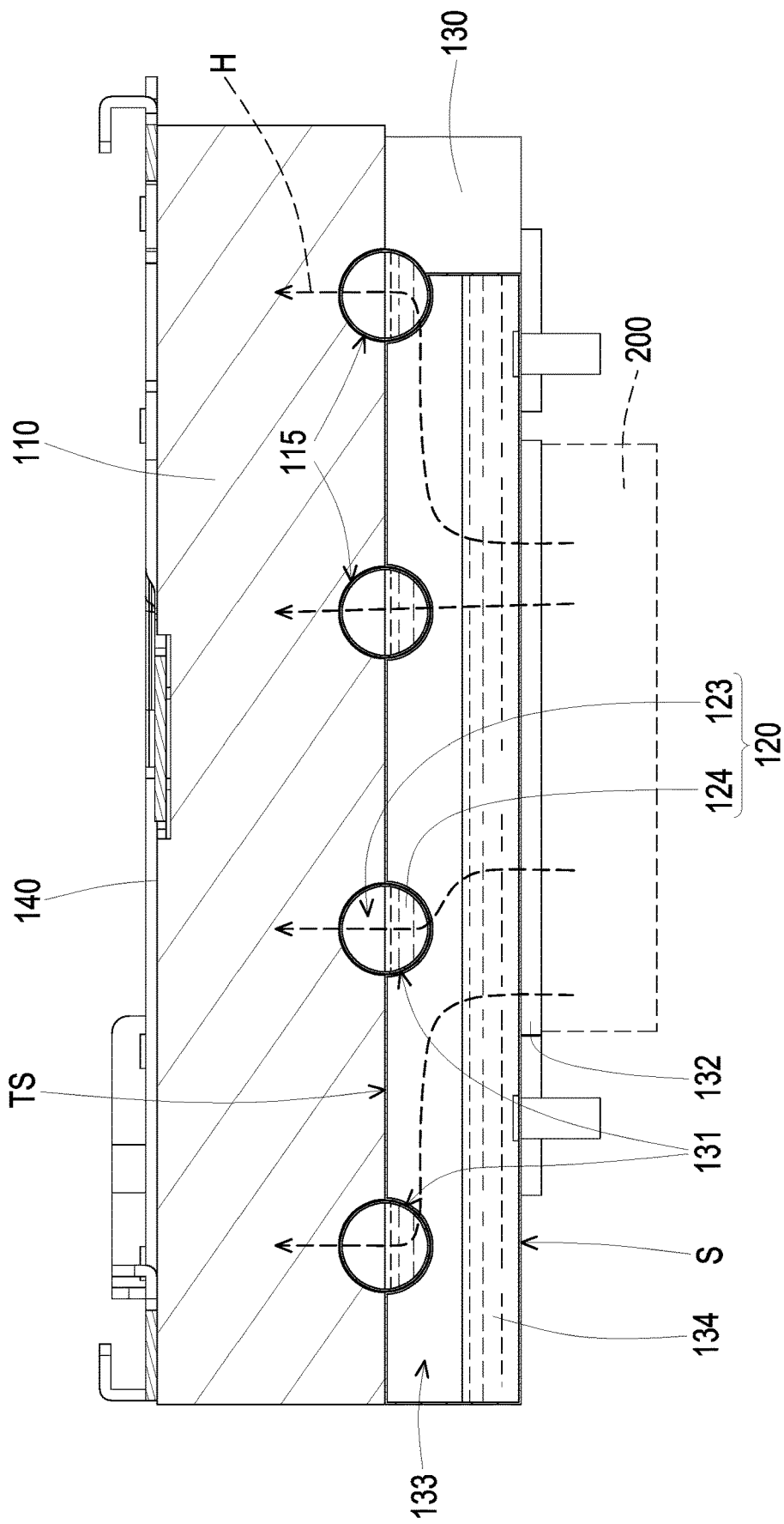
FIG. 2D is a schematic cross-sectional view of the heat dissipation fin group, the vapor chamber and the heat pipes of FIG. 2B along the line A-A.

Referring to FIG. 2D, the vapor chamber 130 is correspondingly disposed on the third fin group 113, and has a plurality of grooves 131. In an embodiment, the number of the grooves 131 is four. The vapor chamber 130 contacts the exposed heat pipes 120 through the grooves 131, and the grooves 131 and the heat pipes 120 conduct heat through contact.

In an embodiment, the grooves 131 extend along the extension direction D and have a shape associated with the cylindrical structure of the heat pipes 120.

Referring to FIG. 2A to FIG. 2C, each of the heat pipes 120 has a straight pipe structure and is parallel to the vapor chamber 130 and the heat dissipation fin group 110. In an embodiment, the vapor chamber 130 is fabricated with grooves by numerical control machining or cold forging. Therefore, each of the grooves 131 can closely match the shape of each of the heat pipes 120 to increase the effective heat dissipation area between the vapor chamber 130 and each of the heat pipes 120.

Figure 1C:
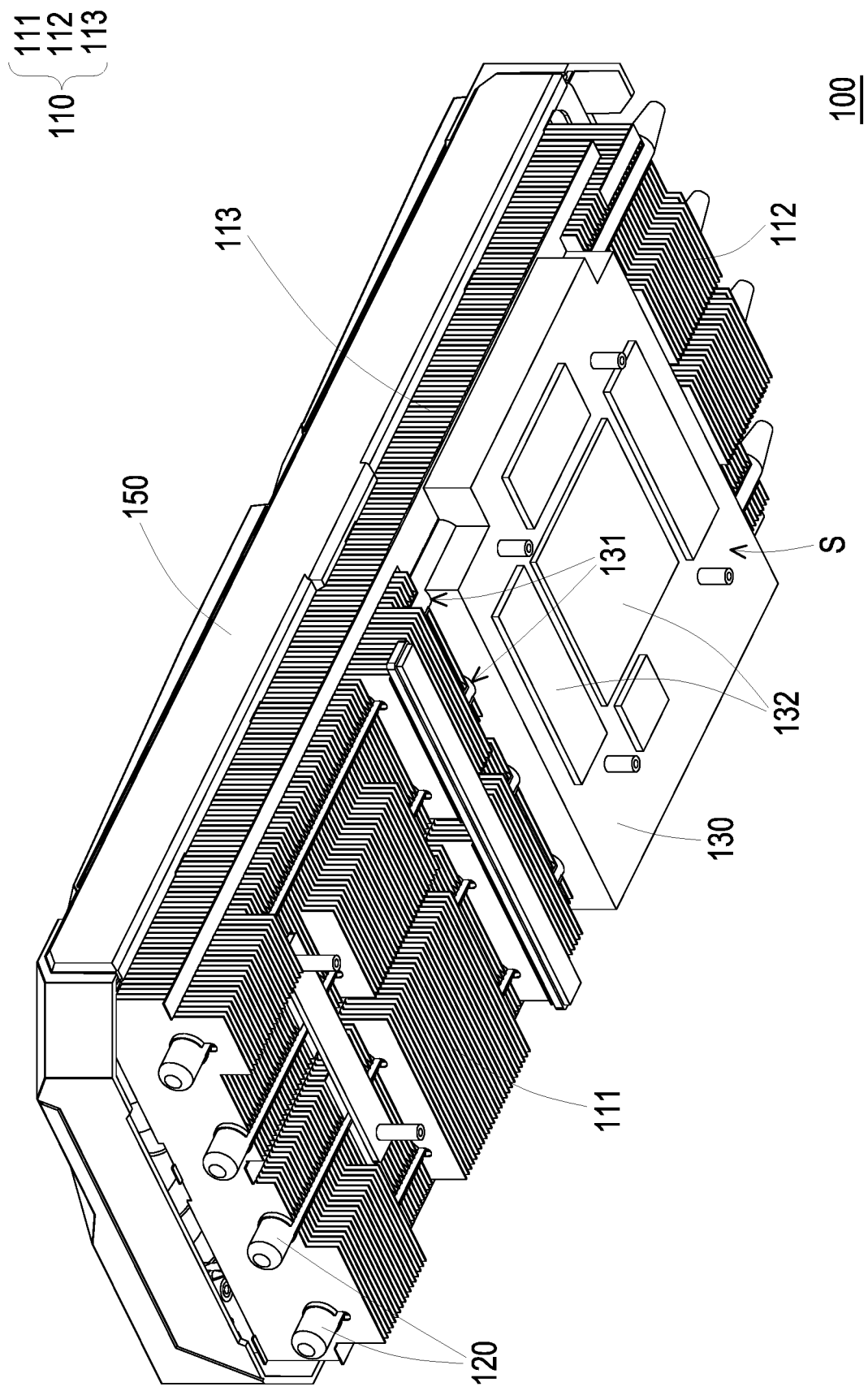
FIG. 1C is a stereoscopic schematic diagram of the heat dissipation device of FIG. 1A from another angle.
Figure 1D:
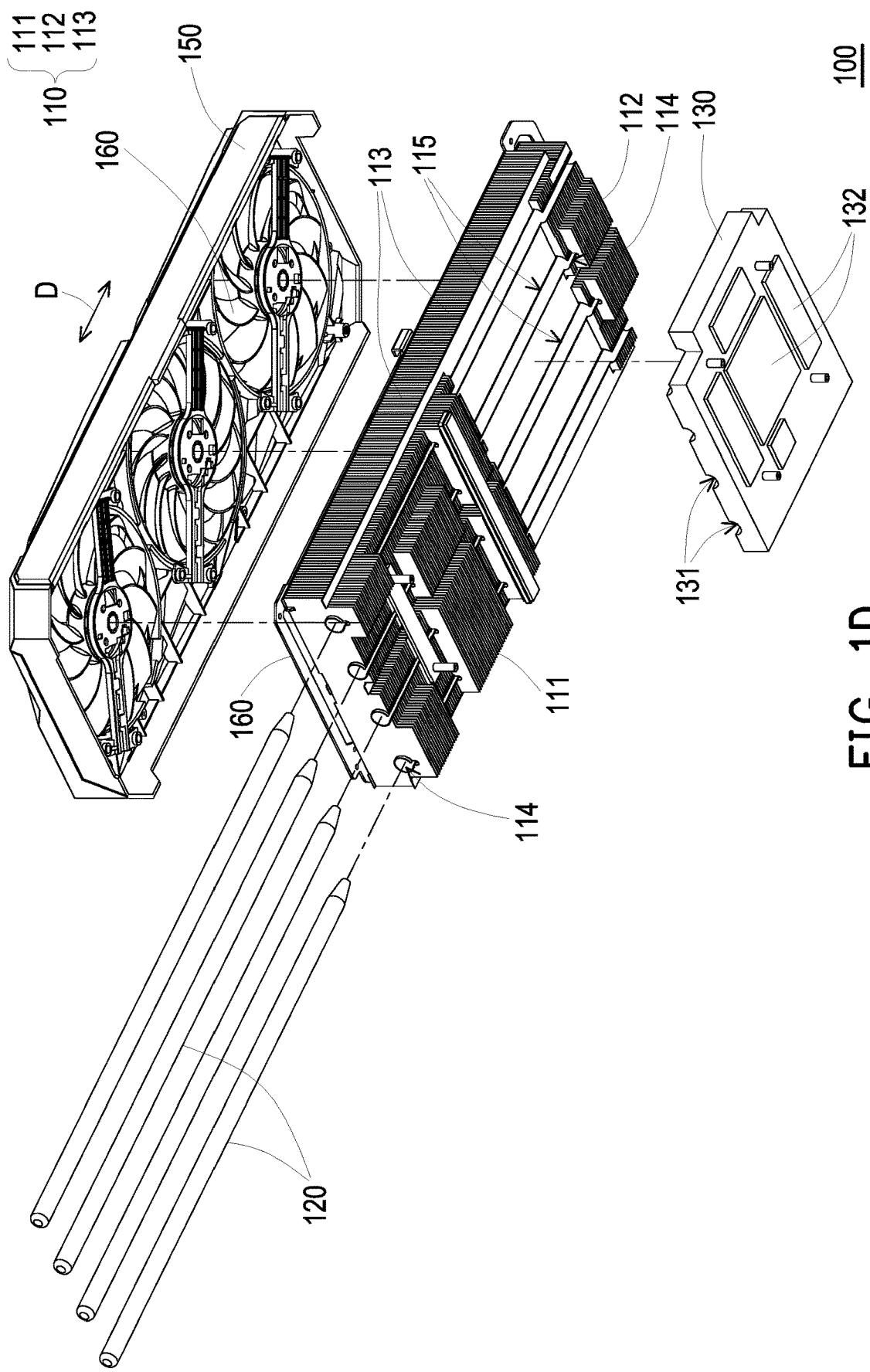
FIG. 1D is an exploded schematic diagram of the components of the heat dissipation device of FIG. 1C.

Referring to FIG. 1C and FIG. 1D, the notches 115 of the third fin group 113 are arranged along the extending direction D to form a plurality of positioning grooves 115. In an embodiment, the number of the positioning grooves 115 is four, which are disposed in the corresponding grooves 131. And each of the positioning grooves 115 accommodates each of the heat pipes 120 protruding from each of the grooves 131, respectively. Herein, the positioning grooves 115 and the heat pipes 120 conduct heat through contact.

In an embodiment, the heat dissipation fin group 110 punches out a positioning groove 115 for each fin 111 through a punching process. Therefore, each of the positioning grooves 115 can closely match the shape of each of the heat pipes 120 to increase the heat exchange area between the vapor chamber 130 and each of the heat pipes 120.

In an embodiment, heat pipes 120 are welded in the corresponding grooves 131 through a solder material. In addition, the vapor chamber 130 and the heat dissipation fin group 110 are fixed by welding or locking with each other, so that each of the heat pipes 120 is limited between the corresponding positioning grooves 115 and the grooves 131.

Referring to FIG. 2D, the grooves 131 of the vapor chamber 130 and the positioning grooves 115 of the third fin group 113 cover the lower half and the upper half of the heat pipes 120, respectively. Among them, the ratio of the covering area of the lower half and the upper half can be adjusted according to the requirements.

Referring to FIG. 1C, FIG. 2A, and FIG. 2D, vapor chamber 130 has a plurality of thermally conductive sheets 132 disposed on the surface S of the vapor chamber 130 facing away from each of the groove 131. The thermally conductive sheets 132 are used to contact the heat source 200 and can improve the thermal conductivity of the vapor chamber 130.

In an embodiment, the thermally conductive sheets is made of graphite, silicone or ceramic.

Referring to FIG. 2A and FIG. 2C, each of the heat pipes 120 has one heat absorption portion 121 and two heat dissipation portions 122. The position of each of the heat pipes 120 corresponding to the third fin group 113 is the heat absorption portion 121. The position of each of the heat pipes 120 corresponding to the first fin group 111 and the second fin group 120 are the heat dissipation portions 122.

The heat absorption portion 121 is disposed between the positioning grooves 115 and the grooves 131 to absorb the heat H from the vapor chamber 130. The heat dissipation portions 122 contact the first fin group 111 and the second fin group 112 of the heat dissipation fin group 110 for transferring the heat H of the heat absorption portion 121 to the heat dissipation fin group 110.

Referring to FIG. 2D, each of the heat pipes 120 has an inner cavity 123 and a heat conduction medium 124. The heat conduction medium 124 is disposed in the inner cavity 123. In detail, the heat conduction medium 124 is sealed in the inner cavity 123. When each of the heat pipes 120 absorbs the heat H from the vapor chamber 130, the heat conduction medium 124 is evaporated into a gaseous state and attached to the wall surface of the inner cavity 123 of the heat pipes 120.

Then, the heat conduction medium 124 releases heat and condenses into liquid again and distributes the inner cavity 123 near the bottom of the vapor chamber 130 through the heat exchange action of the first fin group 111, the second fin group 112 and the third fin group 113 of the heat dissipation fin group 110. Therefore, through the above-mentioned heat conduction medium 124 circulating between evaporation and condensation, heat is transferred to the first fin group 111, the second fin group 112 and the third fin group 113 of the heat dissipation fin group 110 through heat conduction.

Referring to FIG. 2A and FIG. 2D, the vapor chamber 130 has an inner cavity 133 and a heat conduction medium 134. The heat conduction medium 134 is disposed in the inner cavity 133. In detail, heat conduction medium 134 is sealed in the inner cavity 133. When the vapor chamber 130 absorbs the heat from the heat source 200, the heat conduction medium 134 is vaporized into a gaseous state and attached to the wall surface of the inner cavity 133 of the vapor chamber 130. Therefore, the heat is evenly distributed on a top surface TS of the vapor chamber 130 with the groove 131.

Then, the vapor chamber 130 transfers the heat to the plurality of heat pipes 120, so that the heat transfer medium 134 releases the heat and condenses into a liquid state again and is distributed in the inner cavity 133 and close to the surface S. Therefore, through the above-mentioned heat transfer medium 134 circulating between evaporation and condensation, the heat of the heat source 200 is transferred to the plurality of heat pipes 120 through heat conduction, thereby achieving the effects of heat conduction and heat diffusion.

In an embodiment, the volumes of the heat conduction medium 124 and the heat transfer medium 134 are respectively half of the volumes of the inner cavity 123 and the inner cavity 133. In other embodiments, the volume of the heat conduction medium is determined according to the heat dissipation requirements.

In an embodiment, the heat pipes 120 and the vapor chamber 130 are made of metal material, and the inner cavity 123 and the inner cavity 133 are both provided with capillary structures to facilitate the flow of the heat conducting medium.

Referring to FIG. 1A to FIG. 1C, the heat dissipation device 100 further includes a connecting bracket 140, an air guide cover 150 and a plurality of fans 160. The connecting bracket 140 is disposed on a side of the heat dissipation fin group 110 away from the vapor chamber 130. Wherein, the connecting bracket 140 is fixed to one side of the heat dissipation fin group 110 by welding or locking. The air guide cover 150 is arranged on the connecting bracket 140 and has a plurality of air guide openings 151. The fans 160 are rotatably arranged on the air guide openings 151 respectively.

Referring to FIG. 1A, FIG. 2A, and FIG. 2D, in short, the heat dissipation device 100 in the application contacts the heat source 200 with the vapor chamber 130 so that the heat H of the heat source 200 is conducted to the vapor chamber 130, the plurality of heat pipes 120, the third fin group 113, the first fin group 111 and the second fin group 112 in sequence.

Then, with the operation of a plurality of fans 160, the cold air passes through the third fin group 113, the first fin group 111 and the second fin group 112 for heat exchange, thereby transferring the heat of the heat source 200 to the air.

A groove is formed on the vapor chamber in the application. And the groove corresponds to the shape of the heat pipes, thereby increasing the effective heat dissipation area between the heat pipe and the heat pipe. And the heat pipes adopt a straight pipe structure, and no additional shaping is required. Therefore, the loss of heat transfer efficiency is reduced, thereby improving the heat transfer efficiency of the heat pipes.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A heat dissipation device, comprising:
a heat dissipation fin group, having a plurality of fins, the fins are arranged along an extension direction and are divided into a first fin group, a second fin group, and a third fin group, the third fin group is disposed between the first fin group and the second fin group, wherein each fin of the first fin group and the second group includes a plurality of through holes, and each fin of the third fin group includes a plurality of notches;
a plurality of heat pipes, which are cylindrical structure, the heat pipes are disposed through the first fin group and the second fin group by the through holes, and a part of the heat pipes corresponding to the third fin group is in contact with the notches, and another part is exposed to the outside, wherein the plurality of heat pipes are extended along the extension direction; and
a vapor chamber, correspondingly disposed on the third fin group, and having a plurality of grooves, the vapor chamber is in contact with the heat pipes exposed from the grooves, wherein the grooves extend along the extension direction and have a shape associated with the cylindrical structure,
wherein the notches are arranged along the extension direction to form a plurality of positioning grooves, and each of the grooves and each of the positioning grooves respectively cover the lower and upper halves of the heat pipes,
wherein the whole body of each of the heat pipes has a straight heat pipe structure that is parallel to the vapor chamber and the heat dissipation group.

2. The heat dissipation device according to claim 1, wherein the position of each of the heat pipes corresponding to the third fin group is a heat absorption portion, and the position of each of the heat pipes corresponding to the first fin group and the second fin group are two heat dissipation portions.

3. The heat dissipation device according to claim 1, wherein each of the heat pipes has an inner cavity and a heat conduction medium, and the heat conduction medium is disposed in the inner cavity.

4. The heat dissipation device according to claim 1, wherein the vapor chamber has a plurality of thermally conductive sheets disposed on the surface of the vapor chamber facing away from the groove.

5. The heat dissipation device according to claim 1, wherein the heat dissipation fin group, the heat pipes, and the vapor chamber are welded to each other.

* * * * *